(12) United States Patent
Park et al.

(10) Patent No.: US 7,799,704 B2
(45) Date of Patent: Sep. 21, 2010

(54) GAS BAFFLE AND DISTRIBUTOR FOR SEMICONDUCTOR PROCESSING CHAMBER

(75) Inventors: Soonam Park, Sunnyvale, CA (US); Farhan Ahmad, Sunnyvale, CA (US); Hemant P. Mungekar, San Jose, CA (US); Sanjay Kamath, Fremont, CA (US); Young S. Lee, San Jose, CA (US); Siqing Lu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 12/253,687

(22) Filed: Oct. 17, 2008

(65) Prior Publication Data

US 2009/0093129 A1 Apr. 9, 2009

Related U.S. Application Data

(62) Division of application No. 11/564,167, filed on Nov. 28, 2006, now abandoned.

(51) Int. Cl.
*H01L 21/31* (2006.01)
*H01L 21/469* (2006.01)

(52) U.S. Cl. .......... 438/778; 257/E21.24; 257/E21.487

(58) Field of Classification Search ................ 438/778, 438/758, 787, 905, 906; 257/E21.24, E21.487; 118/723; 73/862.323, 204.21
See application file for complete search history.

(56) References Cited

U.S. PATENT DOCUMENTS

| | | | |
|---|---|---|---|
| 4,439,401 A | 3/1984 | Voll et al. | |
| 4,588,000 A | 5/1986 | Malin et al. | |
| 5,322,567 A | 6/1994 | Deaton et al. | |
| 5,441,568 A | 8/1995 | Cho et al. | |
| 5,624,498 A | 4/1997 | Lee et al. | |
| 5,772,771 A | 6/1998 | Li et al. | |
| 5,804,259 A | 9/1998 | Robles | |
| 5,851,294 A | 12/1998 | Young et al. | |
| 5,865,896 A | 2/1999 | Nowak et al. | |

(Continued)

FOREIGN PATENT DOCUMENTS

EP 702392 A2 3/1996

(Continued)

OTHER PUBLICATIONS

Non-Final Office Action for U.S. Appl. No. 11/075,527 mailed on Oct. 14, 2009; 22 pages.

(Continued)

*Primary Examiner*—Davienne Monbleau
*Assistant Examiner*—Monica D Harrison
(74) *Attorney, Agent, or Firm*—Townsend and Townsend and Crew

(57) ABSTRACT

Apparatus and methods for distributing gas in a semiconductor process chamber are provided. In an embodiment, a gas distributor for use in a gas processing chamber comprises a body. The body includes a baffle with a gas deflection surface to divert the flow of a gas from a first direction to a second direction. The gas deflection surface comprises a concave surface. The concave surface comprises at least about 75% of the surface area of the gas deflection surface. The concave surface substantially deflects the gas toward a chamber wall and provides decreased metal atom contamination from the baffle so that season times can be reduced.

10 Claims, 9 Drawing Sheets

U.S. PATENT DOCUMENTS

| | | | |
|---|---|---|---|
| 5,994,662 | A | 11/1999 | Murugesh |
| 6,013,155 | A | 1/2000 | McMillin et al. |
| 6,070,551 | A | 6/2000 | Li et al. |
| 6,083,344 | A | 7/2000 | Hanawa et al. |
| 6,143,078 | A | 11/2000 | Ishikawa et al. |
| 6,170,428 | B1 | 1/2001 | Redeker et al. |
| 6,217,658 | B1 | 4/2001 | Orczyk et al. |
| 6,302,965 | B1 | 10/2001 | Umotoy et al. |
| 6,335,288 | B1 | 1/2002 | Kwan et al. |
| 6,383,964 | B1 | 5/2002 | Nakahara et al. |
| 6,416,823 | B2 | 7/2002 | Li et al. |
| 6,444,039 | B1 | 9/2002 | Nguyen |
| 6,450,117 | B1 | 9/2002 | Murugesh et al. |
| 6,453,992 | B1 | 9/2002 | Kim |
| 6,589,610 | B2 | 7/2003 | Li et al. |
| 6,596,653 | B2 | 7/2003 | Tan et al. |
| 6,676,760 | B2 | 1/2004 | Kholodenko et al. |
| 6,737,812 | B2 | 5/2004 | Yuasa et al. |
| 6,786,973 | B2 | 9/2004 | Strauch et al. |
| 6,800,139 | B1 | 10/2004 | Shinriki et al. |
| 6,821,910 | B2 | 11/2004 | Adomaitis et al. |
| 6,884,296 | B2 | 4/2005 | Basceri et al. |
| 6,960,262 | B2 | 11/2005 | Sasaki et al. |
| 6,989,061 | B2 | 1/2006 | DeMent et al. |
| 7,105,060 | B2 | 9/2006 | Shimogaki et al. |
| 7,183,227 | B1 | 2/2007 | Rasheed et al. |
| 7,294,207 | B2 | 11/2007 | Strauch et al. |
| 7,316,761 | B2 | 1/2008 | Doan et al. |
| 7,510,624 | B2 | 3/2009 | Liang et al. |
| 2001/0033900 | A1 | 10/2001 | M'Saad et al. |
| 2002/0039625 | A1 | 4/2002 | Powell et al. |
| 2002/0187655 | A1 | 12/2002 | Tan et al. |
| 2003/0159656 | A1 | 8/2003 | Tan et al. |
| 2003/0177977 | A1 | 9/2003 | Strauch et al. |
| 2004/0060514 | A1 | 4/2004 | Janakiraman et al. |
| 2004/0126952 | A1 | 7/2004 | Gondhalekar et al. |
| 2004/0231798 | A1 | 11/2004 | Gondhalekar et al. |
| 2005/0000441 | A1 | 1/2005 | Kaeppeler et al. |
| 2005/0218115 | A1 | 10/2005 | Lei et al. |
| 2006/0048707 | A1 | 3/2006 | Lei et al. |
| 2006/0075967 | A1 | 4/2006 | Lu et al. |
| 2006/0130756 | A1 | 6/2006 | Liang et al. |
| 2006/0196410 | A1 | 9/2006 | Hishitani et al. |
| 2006/0196420 | A1 | 9/2006 | Ushakov et al. |
| 2006/0196603 | A1 | 9/2006 | Lei et al. |
| 2008/0121177 | A1* | 5/2008 | Bang et al. ............... 118/723.1 |
| 2008/0121178 | A1 | 5/2008 | Bang et al. |
| 2008/0121179 | A1 | 5/2008 | Park et al. |
| 2008/0124944 | A1 | 5/2008 | Park et al. |
| 2008/0185284 | A1 | 8/2008 | Chen et al. |
| 2008/0188087 | A1 | 8/2008 | Chen et al. |
| 2008/0188090 | A1 | 8/2008 | Chen et al. |
| 2009/0042407 | A1 | 2/2009 | Bang et al. |

FOREIGN PATENT DOCUMENTS

| | | |
|---|---|---|
| JP | 55-166926 | 12/1980 |
| JP | 2006-310481 A | 11/2006 |
| JP | 2007-305890 A | 11/2007 |
| WO | 2006/096674 A1 | 9/2006 |

OTHER PUBLICATIONS

Non-Final Office Action for U.S. Appl. No. 11/564,122 mailed on Jan. 6, 2010; 17 pages.
Non-Final Office Action for U.S. Appl. No. 11/564,150 mailed on Jan. 6, 2010; 20 pages.
Notice of Allowance for U.S. Appl. No. 11/075,527 mailed on Mar. 10, 2010; 6 pages.
Non-Final Office Action for U.S. Appl. No. 11/016,166 mailed on Oct. 4, 2006; pp. 9.
Notice of Allowance for U.S. Appl. No. 11/016,166 mailed on Nov. 25, 2008; 9 pages.
Non-Final Office Action for U.S. Appl. No. 11/075,527 mailed on Jan. 12, 2007; 20 pages.
Non-Final Office Action for U.S. Appl. No. 11/075,527 mailed on Jan. 15, 2008; 17 pages.
Final Office Action for U.S. Appl. No. 11/075,527 mailed on Aug. 6, 2008; 18 pages.
Non-Final Office Action for U.S. Appl. No. 11/075,527 mailed on Oct. 30, 2008; 17 pages.
Non-Final Office Action for U.S. Appl. No. 11/564,105 mailed on Jul. 10, 2008; 11 pages.
Final Office Action for U.S. Appl. No. 11/564,105 mailed on Jan. 8, 2009; 12 pages.
Non-Final Office Action for U.S. Appl. No. 11/564,167 mailed on Dec. 16, 2008; 15 pages.
International Search Report for PCT/US2006/008003 mailed on Jun. 28, 2006; 3 pages.
Written Opinion Report for PCT/US2006/008003 mailed on Jun. 28, 2006; 6 pages.

* cited by examiner

GAS BAFFLE AND DISTRIBUTOR FOR SEMICONDUCTOR PROCESSING CHAMBER

CROSS REFERENCE TO RELATED APPLICATION DATA

The present application is a Divisional of Ser. No. 11/564,167 filed Nov. 28, 2006; the full disclosure of which is incorporated herein by reference in its entirety.

BACKGROUND OF THE INVENTION

The present invention relates generally to the field of semiconductor manufacturing. More particularly the present invention relates to a gas baffles and processes for delivering gases used in the formation of integrated circuits.

One of the primary steps in the fabrication of modern semiconductor devices is the formation of a film, such as a silicon oxide film, on a semiconductor substrate. Silicon oxide is widely used as a dielectric layer in the manufacture of semiconductor devices. As is well known, a silicon oxide film can be deposited by a thermal chemical-vapor deposition ("CVD") process or by a plasma-enhanced chemical-vapor deposition ("PECVD") process. In a conventional thermal CVD process, reactive gases are supplied to a surface of the substrate, where heat-induced chemical reactions take place to produce a desired film. In a conventional plasma-deposition process, a controlled plasma is formed to decompose and/or energize reactive species to produce the desired film.

Semiconductor device geometries have decreased significantly in size since such devices were first introduced several decades ago, and continue to be reduced in size. This continuing reduction in the scale of device geometry has resulted in a dramatic increase in the density of circuit elements and interconnections formed in integrated circuits fabricated on a semiconductor substrate. One persistent challenge faced by semiconductor manufacturers in the design and fabrication of such densely packed integrated circuits is the desire to prevent spurious interactions between circuit elements, a goal that has required ongoing innovation as geometry scales continue to decrease.

Unwanted interactions are typically prevented by providing spaces between adjacent elements that are filled with a dielectric material to isolate the elements both physically and electrically. Such spaces are sometimes referred to herein as "gaps" or "trenches," and the processes for filling such spaces are commonly referred to in the art as "gap-fill" processes. The ability of a given process to produce a film that completely fills such gaps is thus often referred to as the "gap-fill ability" of the process, with the film described as a "gap-fill layer" or "gap-fill film." As circuit densities increase with smaller feature sizes, the widths of these gaps decrease, resulting in an increase in their aspect ratio, which is defined by the ratio of the gap's height to its depth. High-aspect-ratio gaps are difficult to fill completely using conventional CVD techniques, which tend to have relatively poor gap-fill abilities. One family of dielectric films that is commonly used to fill gaps in intermetal dielectric ("IMD") applications, premetal dielectric ("PMD") applications, and shallow-trench-isolation ("STI") applications, among others, is silicon oxide (sometimes also referred to as "silica glass" or "silicate glass").

Some integrated circuit manufacturers have turned to the use of high-density plasma CVD ("HDP-CVD") systems in depositing silicon oxide gap-fill layers. Such systems form a plasma that has a density greater than about $10^{11}$ ions/cm$^3$, which is about two orders of magnitude greater than the plasma density provided by a standard capacitively coupled plasma CVD system. Inductively coupled plasma ("ICP") systems are examples of HDP-CVD systems. One factor that allows films deposited by such HDP-CVD techniques to have improved gap-fill characteristics is the occurrence of sputtering simultaneous with deposition of material. Sputtering is a mechanical process by which material is ejected by impact, and is promoted by the high ionic density of the plasma in HDP-CVD processes. The sputtering component of HDP deposition thus slows deposition on certain features, such as the corners of raised surfaces, thereby contributing to the increased gap-fill ability.

Even with the use of HDP and ICP processes, there remain a number of persistent challenges in achieving desired deposition properties. These include the need to manage thermal characteristics of the plasma within a processing chamber, particularly with high-energy processes that may result in temperatures that damage structures in the chamber and cause contamination. For example, high temperatures have been associated with the formation and sublimation of $AlF_3$, resulting in erosion system components exposed to such high temperatures and deposition of the aluminum impurities on substrates. Fluorine is highly corrosive and often present in chambers a clean gas to corrosively remove material from the chamber wall and also as an etch gas. For example, dissociated $NF_3$ can be introduced into the chamber from a back-side of the baffle to clean the chamber or as an etch component of deposition-etch-deposition recipes which use $NF_3$ plasma within the chamber.

In addition, there is a general desire to provide deposition processes that are uniform across a wafer. Non-uniformities lead to inconsistencies in device performance and may result from a number of different factors. The deposition characteristics at different points over a wafer result from a complex interplay of a number of different effects. For example, the way in which gas is introduced into the chamber, the level of power used to ionize precursor species, the use of electrical fields to direct ions, and the like, may ultimately affect the uniformity of deposition characteristics across a wafer. In addition, the way in which these effects are manifested may depend on the physical shape and size of the chamber, such as by providing different diffusive effects that affect the distribution of ions in the chamber.

Work in relation with embodiments of the present invention suggests the current systems and methods may be less than ideal. For example, as semiconductor circuits and the associated gaps between circuit elements shrink, contamination by small particles can become problematic, especially where the particle size approximates the size of a gap. Also, contamination with metal in the gap-fill layer, for example Al, can decrease the desired electrically insulative properties of the dielectric gap-fill layer. This contamination can result in decreased yields, wasted material and in some instances faulty circuits. As a result, one specification of HDP-CVD process films for shallow trench isolation is Al content of the film.

One approach to prevent wafer contamination has been to season the chamber with a protective coating prior to placing a wafer in the chamber. For example, process chambers are often seasoned with a deposition gas, for example $SiH_4$, that deposits a protective coating inside the chamber, for example on the chamber walls, to prevent contamination and protect the chamber from erosion by the clean gas. However, seasoning the chamber with a protective coating takes time, and a typical season time can be on the order of 120 seconds. As a result, the throughput, the number of wafers processed over a given period of time, is decreased, and the throughput of current semiconductor process systems may be less than ideal. Work in relation with the present invention suggests that wafer production throughput can be increased by decreasing the amount of time required to process a wafer, for example by decreasing the season time. Shown in FIG. 1 is an embodiment of a prior art gas baffle that has been used in semiconductor process chambers and shown to present at least some of the shortcomings described above.

There is accordingly a general need in the art for improved systems and methods providing deposition uniformity with decreased contamination from metal atoms, for example aluminum atoms, and increased throughput in HDP and ICP processes.

BRIEF SUMMARY OF THE INVENTION

Embodiments of the present invention provide methods and an apparatus for processing semiconductors. More particularly, embodiments of the present invention provide a gas distributor used to distribute a gas in a processing chamber, for example a clean gas and/or a deposition gas.

In one embodiment of the present invention, gas distributor for use in a semiconductor processing chamber comprises a body. The body includes a baffle with a gas deflection surface to divert the flow of a gas from a first direction to a second direction. The gas deflection surface comprises a concave portion. The concave portion comprises at least about 75% of the surface area of the gas deflection surface.

In another embodiment of the present invention, a substrate processing chamber comprises an enclosure having a ceiling and a sidewall, and a substrate support adapted to support a substrate. A gas distributor is positioned centrally above the substrate support. The gas distributor comprises a body that includes a baffle. The baffle has an upper exposed surface adapted to outwardly direct gas away from the body and towards the enclosure sidewall. The upper exposed surface comprises a concave portion, and the concave portion comprises at least about 75% of the area of the upper exposed surface of the baffle. The distributor comprises a lower surface below the upper surface and spaced apart from the substrate support. The lower surface is adapted to inject a deposition gas into the chamber.

In an additional embodiment of the present invention, a gas distributor for use in a gas processing chamber comprises a body. The body includes a baffle to divert a gas. The baffle comprises a concave surface to deflect the gas from a first direction to a second direction. The baffle also includes a convex surface disposed peripheral to the concave surface. A transition surface is disposed between the concave surface and the convex surface to provide a transition from the concave surface to the convex surface. The convex surface comprises a maximum with across the baffle. The transition surface extends along the for no more than about 20% of the maximum width.

In a further embodiment of the present invention, a method of deflecting a gas used in a semiconductor process is provided. A clean gas is directed toward a gas distributor in a first direction. The gas distributor comprises a concave surface. The gas is deflected from the first direction to a second direction substantially with the concave surface. The second direction is transverse to the first direction.

In another embodiment of the present invention, a method of processing a semiconductor wafer in a semiconductor process chamber is provided. The method comprises cleaning the chamber with a clean gas. The chamber is seasoned for about 25 to 60 seconds. The wafer is placed in the chamber to coat the wafer with a dielectric layer. The wafer is coated with the dielectric layer with an HDP process and/or a CVD process. The dielectric layer has no more than about $2 \times 10^{12}$ metal atoms per square centimeter. The coated wafer is removed from the chamber.

In yet another embodiment of the present invention, a substrate processing device is provided. The device includes an enclosure having a ceiling and a sidewall. A substrate support is adapted to support a semiconductor substrate within the enclosure. A high density plasma deposition system is adapted to deliver a high density plasma to the substrate to form a dielectric layer on the substrate. A gas distributor is positioned centrally above the substrate support. A gas delivery system is adapted to control gas delivery to the gas distributor. A processor is coupled to the gas delivery system and the plasma deposition system to season the chamber and apply the dielectric layer to the wafer. The baffle and the enclosure are adapted to provide no more than about $1.5 \times 10^{12}$ metal atoms per square centimeter on the layer for a high power process with a season time of about 25 to 60 seconds.

Many benefits are achieved by the present invention over conventional techniques. Embodiments of the present invention use a concave surface to deflect the gas and direct the gas toward the chamber wall to provide decreased wafer contamination, for example decreased aluminum contamination. Also, embodiments of the present invention provide decreased metal atom contamination, for example aluminum atom contamination, of the gap-fill layer with reduced season times, so that the total amount of time required to process a semiconductor wafer is reduced. At least some of these benefits are provided by the embodiments of the present invention described herein below.

DETAILED DESCRIPTION OF THE INVENTION

Embodiments of the present invention provide methods and an apparatus for processing semiconductors. More particularly, embodiments of the present invention provide a gas distributor used to distribute clean gas and to distribute a deposition gas in a processing chamber.

Figure 1:
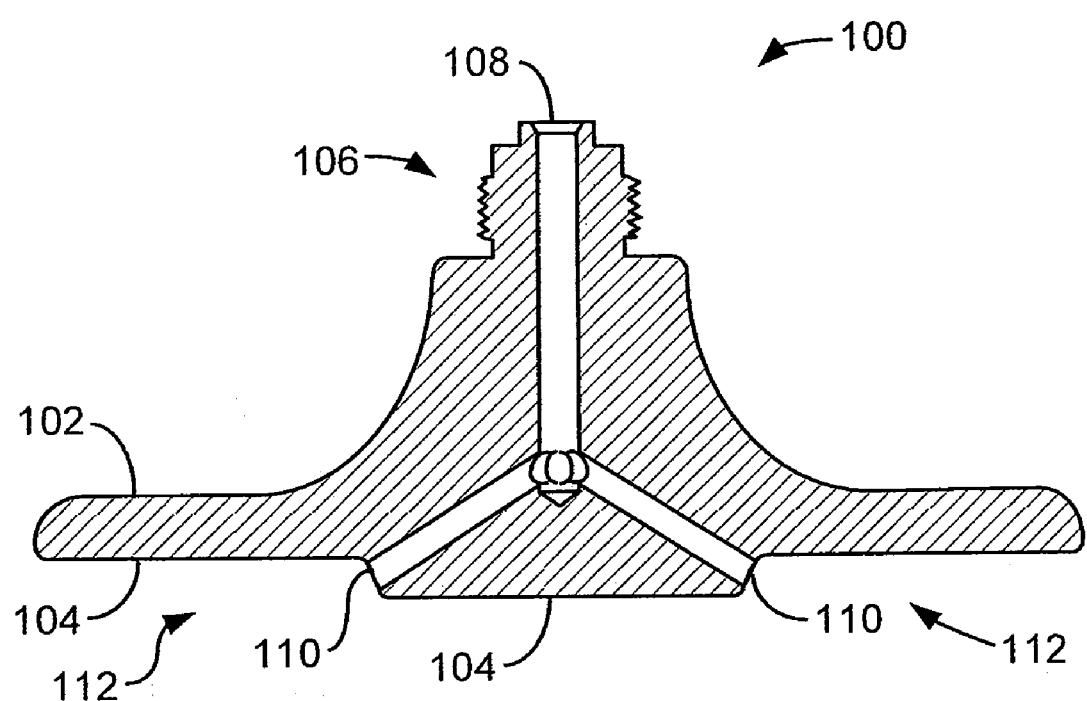
FIG. 1 is a cross-sectional view of a previously known gas distributor.

FIG. 1 shows a previously known gas distributor. Gas distributor 100 has a gas deflecting surface 102 and a gas distributor face 104. Gas deflecting surface 102 provides a pathway for cleaning gases during a chamber clean process. Cleaning gases are directed to the chamber walls instead of a substrate support member located directly below the gas distributor. The gas distributor 100 is connected to a chamber wall at a proximal portion 106. During a CVD process, a deposition gas is supplied to the gas distributor 100 at the proximal end 108. This deposition gas flows through gas distributor 100, exiting at apertures 110, and onto a substrate position on the substrate support member. As illustrated in FIG. 1, apertures 110 are disposed on the gas distributor face 104 at a step 112, a raised surface.

1. Exemplary ICP Chamber

Figure 2:
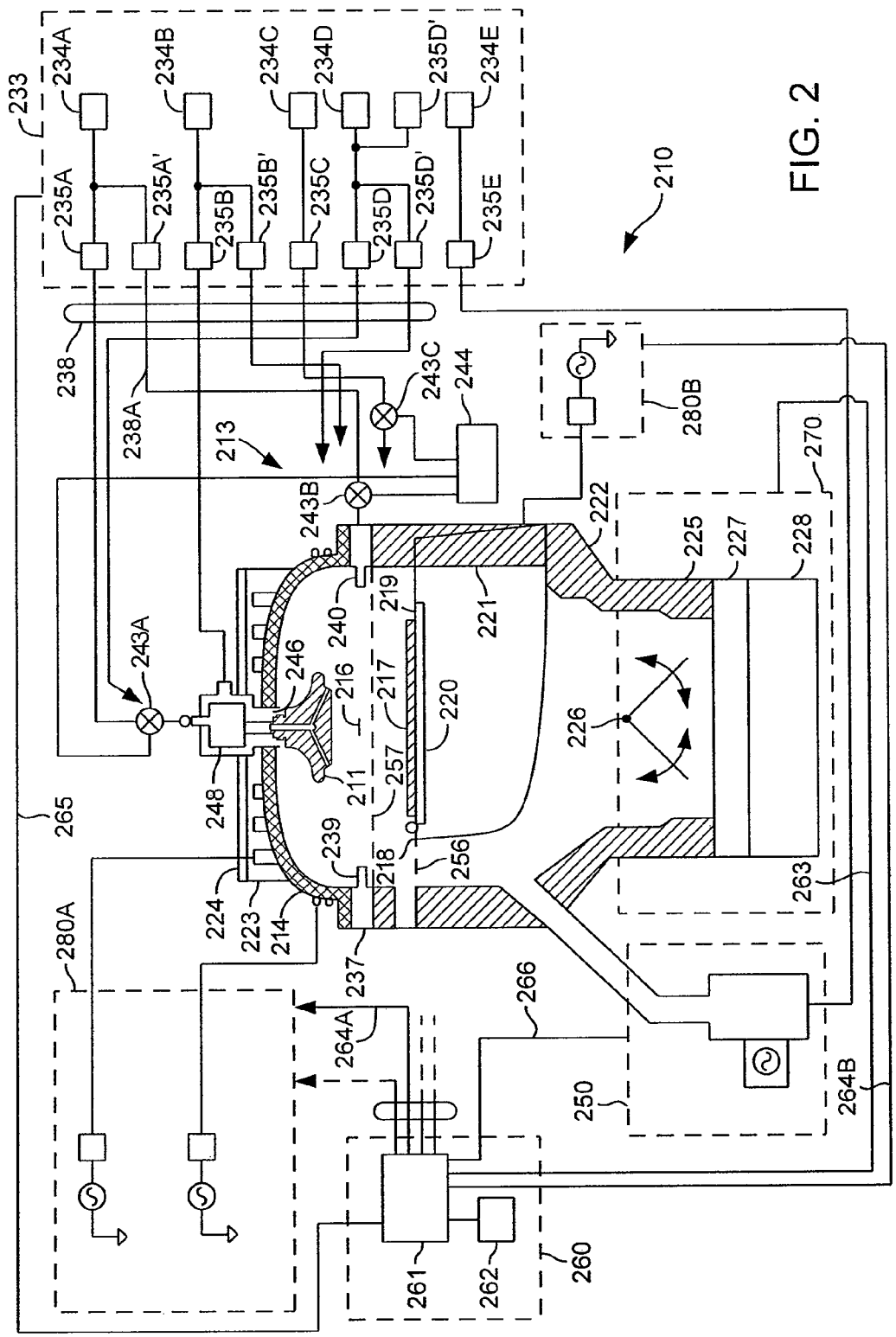
FIG. 2 is a simplified cross-sectional view of an exemplary ICP reactor system.

The inventors have implemented embodiments of the invention with the ULTIMA™ system manufactured by APPLIED MATERIALS, INC., of Santa Clara, Calif., a general description of which is provided in commonly assigned U.S. Pat. Nos. 5,994,662; 6,170,428; and 6,450,117; and U.S. patent application Ser. Nos. 10/963,030 and 11/075,527; the entire disclosures of these patents and applications are incorporated herein by reference. An overview of the ICP reactor is provided in connection with FIG. 2. FIG. 2 schematically illustrates the structure of an exemplary HDP-CVD system 210 in one embodiment. The system 210 includes a chamber 213, a vacuum system 270, a source plasma system 280A, a bias plasma system 280B, a gas delivery system 233, and a remote plasma cleaning system 250. Although remote plasma cleaning system 250 is shown on the lower part of the system, other locations are possible, for example near the top of the chamber as described in U.S. application Ser. No. 10/963, 030, the full disclosure of which has been previously incorporated herein by reference.

The upper portion of chamber 213 includes a dome 214, which is made of a ceramic dielectric material, such as aluminum oxide or aluminum nitride, sapphire, SiC or quartz. A heater plate 223 and a cold plate 224 surmount, and are thermally coupled to, dome 214. Heater plate 223 and cold plate 224 allow control of the dome temperature to within about ±10° C. over a range of about 100° C. to 200° C. Dome 214 defines an upper boundary of a plasma processing region 216. Plasma processing region 216 is bounded on the bottom by the upper surface of a substrate 217 and a substrate support member 218.

The lower portion of chamber 213 includes a body member 222, which joins the chamber to the vacuum system. A base portion 221 of substrate support member 218 is mounted on, and forms a continuous inner surface with, body member 222. Substrates are transferred into and out of chamber 213 by a robot blade (not shown) through an insertion/removal opening (not shown) in the side of chamber 213. Lift pins (not shown) are raised and then lowered under the control of a motor (also not shown) to move the substrate from the robot blade at an upper loading position 257 to a lower processing position 256 in which the substrate is placed on a substrate receiving portion 219 of substrate support member 218. Substrate receiving portion 219 includes an electrostatic chuck 220 that secures the substrate to substrate support member 218 during substrate processing. In a preferred embodiment, substrate support member 218 is made from an aluminum oxide or aluminum ceramic material.

Vacuum system 270 includes throttle body 225, which houses twin-blade throttle valve 226 and is attached to gate valve 227 and turbo-molecular pump 228. It should be noted that throttle body 225 offers minimum obstruction to gas flow, and allows symmetric pumping. Gate valve 227 can isolate pump 228 from throttle body 225, and can also control chamber pressure by restricting the exhaust flow capacity when throttle valve 226 is fully open. The arrangement of the throttle valve, gate valve, and turbo-molecular pump allow accurate and stable control of chamber pressures from between about 1 millitorr to about 2 torr.

A gas delivery system 233 provides gases from several sources, 234A-234E chamber for processing the substrate via gas delivery lines 238 (only some of which are shown). As would be understood by a person of skill in the art, the actual sources used for sources 234A-234E and the actual connection of delivery lines 238 to chamber 213 varies depending on the deposition and cleaning processes executed within chamber 213. Gases are introduced into chamber 213 through a gas ring 237 and/or a gas distributor 211.

In one embodiment, first and second gas sources, 234A and 234B, and first and second gas flow controllers, 235A' and 235B', provide gas to ring plenum in gas ring 237 via gas delivery lines 238 (only some of which are shown). Gas ring 237 has a plurality of source gas nozzles 239 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 237 has 12 source gas nozzles made from an aluminum oxide ceramic.

Gas ring 237 also has a plurality of oxidizer gas nozzles 240 (only one of which is shown), which in a preferred embodiment are co-planar with and shorter than source gas nozzles 239, and in one embodiment receive gas from body plenum. In some embodiments it is desirable not to mix source gases and oxidizer gases before injecting the gases into chamber 213. In other embodiments, oxidizer gas and source gas may be mixed prior to injecting the gases into chamber 213 by providing apertures (not shown) between body plenum and gas ring plenum. In one embodiment, third, fourth, and fifth gas sources, 234C, 234D, and 234D', and third and fourth gas flow controllers, 235C and 235D', provide gas to body plenum via gas delivery lines 238. Additional valves, such as 243B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 243B, to isolate chamber 213 from delivery line 238A and to vent delivery line 238A to vacuum foreline 244, for example. As shown in FIG. 2, other similar valves, such as 243A and 243C, may be incorporated on other gas delivery lines.

Referring again to FIG. 2, chamber 213 also has gas distributor 211 and top vent 246. Gas distributor 211 and top vent 246 allow independent control of top and side flows of the gases, which improves film uniformity and allows fine adjustment of the film's deposition and doping parameters. Top vent 246 is an annular opening around gas distributor 211. Gas distributor 211 includes a plurality of apertures in a step according to an embodiment of the present invention for improved gas distribution. In one embodiment, first gas source 234A supplies source gas nozzles 239 and gas distributor 211. Source nozzle MFC 235A' controls the amount of gas delivered to source gas nozzles 239 and top nozzle MFC 235A controls the amount of gas delivered to gas distributor 211. Similarly, two MFCs 235B and 235B' may be used to control the flow of oxygen to both top vent 246 and oxidizer gas nozzles 240 from a single source of oxygen, such as source 234B. The gases supplied to gas distributor 211 and top vent 246 may be kept separate prior to flowing the gases into chamber 213, or the gases may be mixed in top plenum 248 before they flow into chamber 213. Separate sources of the same gas may be used to supply various portions of the chamber.

System controller 260 controls the operation of system 210. In a preferred embodiment, controller 260 includes a memory 262, which comprises a tangible medium such as a hard disk drive, a floppy disk drive (not shown), and a card rack (not shown) coupled to a processor 261. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 260 operates under the control of a computer program stored on the tangible medium for example the hard disk drive, or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT"), and a light pen.

System controller 260 controls the season time of the chamber and gases used to season the chamber, the clean time and gases used to clean the chamber, and the application of plasma with the HDP CVD process. To achieve this control, the system controller 260 is coupled to many of the components of system 210. For example, system controller 260 is coupled to vacuum system 270, source plasma system 280A, bias plasma system 280B, gas delivery system 233, and remote plasma cleaning system 250. System controller 260 is coupled to vacuum system 270 with a line 263. System controller 260 is coupled to source plasma system 280 with a line 264A and to bias plasma system 280B with a line 264B. System controller 260 is coupled to gas delivery system 233 with a line 265. System controller 260 is coupled to remote plasma cleaning system 250 with a line 266. Lines 263, 264A, 264B, 265 and 266 transmit control signals from system controller 260 to vacuum system 270, source plasma system 280A, bias plasma system 280B, gas delivery system 233, and remote plasma cleaning system 250, respectively. It will be understood that system controller 260 can include several distributed processors to control the components of system 210.

2. Baffle Characteristics

Embodiments of the present invention described herein use a concave surface of a baffle to substantially deflect and substantially direct a clean gas horizontally toward a chamber wall in HDP-CVD processes. By deflecting the clean gas with the concave surface and directing the clean gas toward the chamber wall with the concave surface, heat is readily conducted from gas deflection surfaces of the baffle. This heat conduction results from the baffle shape associated with concave gas deflection surface. The use of the concave gas deflection surface to substantially deflect and substantially direct clean gas toward the chamber wall also permits clean gas deflection and direction without the use of a substantial extended flange.

At least two mechanisms are believed to contribute Al wafer contamination. One mechanism is formation of aluminum fluoride ($AlF_3$). A baffle is typically made of a single piece of aluminum nitride (AlN) or aluminum oxide ($Al_2O_3$), and either of these materials can react with fluorine to form aluminum fluoride. Formation of $AlF_3$ on the baffle is related to baffle temperature during the clean/etch steps. Another mechanism that contributes to wafer contamination is $AlF_3$ sublimation. As a result of these two mechanisms, $AlF_3$ is formed on the baffle by chemical reaction and is subsequently removed by sublimation, thereby allowing more AlN or $Al_2O_3$ to react with fluorine. Lower temperatures of the baffle during the clean etch steps results in less sublimation of the $AlF_3$. As sublimated $AlF_3$ is deposited on the semiconductor wafer substrate, less $AlF_3$ sublimation results in less Al on the film formed with a gap-fill process.

Deflecting and directing the clean gas toward the chamber wall with the concave surface can result in decreased Al contamination on the gap fill layer of the processed wafer. Typically, wafer contamination from metal atoms includes a dominant species of metal atoms deposited in the wafer. This dominant species of metal atoms in the wafer corresponds to a dominant species of metal atoms in the gas distributor, for example Al metal atoms from an AlN gas distributor. By decreasing sublimation and chemical reactions on the baffle, the amount of metal atoms removed from the baffle during the deposition process is decreased and the number of metal atoms deposited on the wafer is decreased. Thus, the season time can be reduced because a thinner protective coating on the baffle will provide low Al contamination. As a result, semiconductor wafer throughput is increased while still providing low Al wafer contamination.

Embodiments of the present invention can be used with low, medium and high power HDP/CVD processes. High power process typically include power with a range from about 15 to 18 kW. Medium power processes typically include power with a range from about 8 to 12 kW. Low power processes are generally under about 8 kW. Many embodiments of the present invention can be used to process 300 mm wafers, although other wafer sizes, for example 200 mm wafers and 450 mm wafers can be processed with embodiments of the present invention.

Figure 3A:
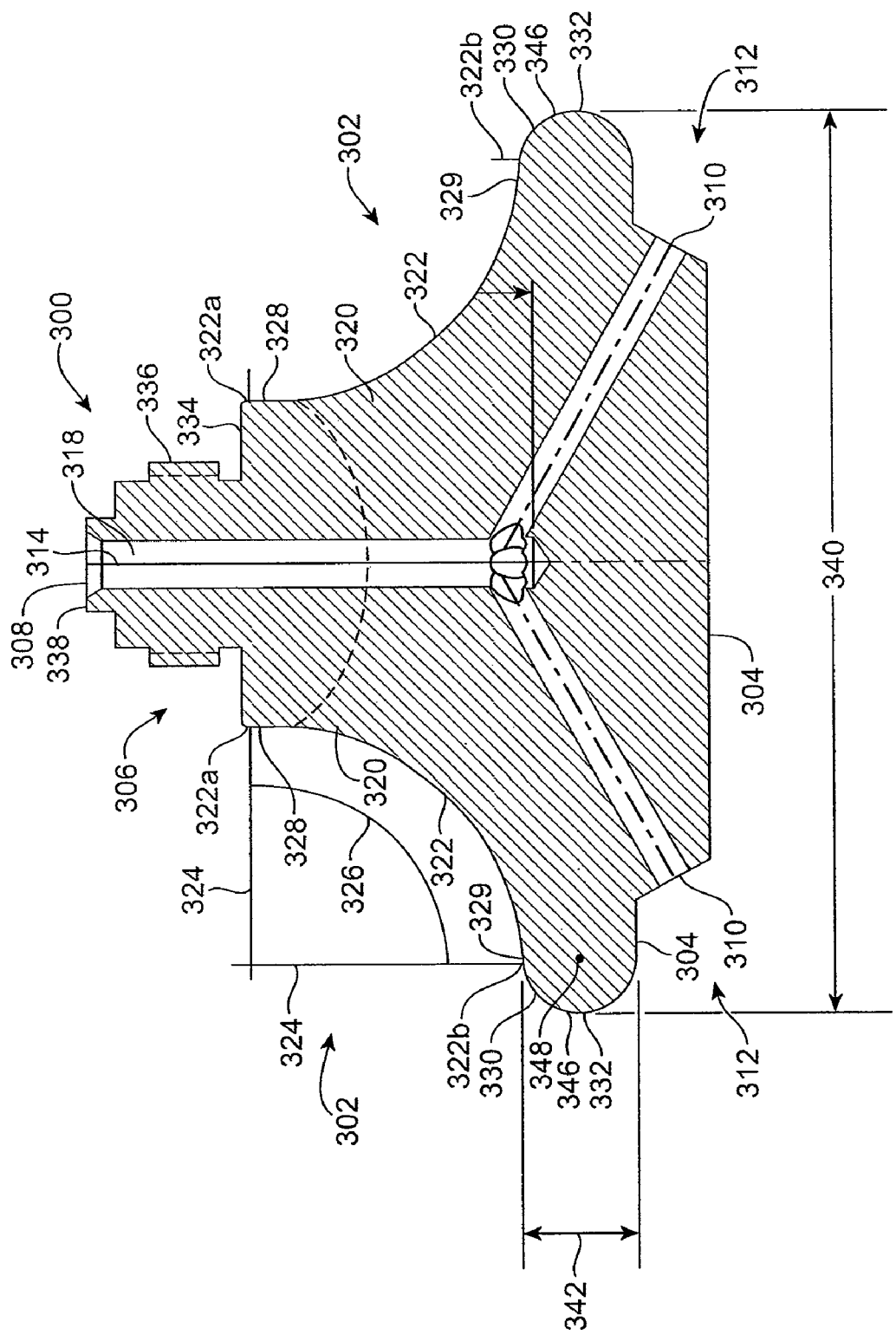
FIG. 3A is a cross-sectional view of a gas distributor according to an embodiment of the present invention.

FIG. 3A is a cross-sectional view of a gas distributor according to an embodiment of the present invention. This diagram is merely an example, which should not unduly limit the scope of the claims herein. One of ordinary skill in the art would recognize other variations, modifications, and alternatives. As shown, the present invention provides a gas distributor 300 for introducing a gas into a semiconductor processing chamber. Gas distributor 300 is made of aluminum nitride (AlN), and can be made with any suitable material such as aluminum oxide (alumina, $Al_2O_3$), silicon carbide (SiC), zirconium, quartz, sapphire and the like. In this embodiment, gas distributor 300 is a single piece.

Gas distributor 300 has a gas deflection surface 302 and a gas distributor face 304. Gas deflection surface 302 provides a pathway for cleaning gases during a chamber clean process. Cleaning gases are directed to the chamber walls instead of the substrate support member located directly below the gas distributor. The gas distributor 300 is connected to a chamber wall at a proximal portion 306. During a CVD process, a deposition gas is supplied to the gas distributor 300 at the proximal end 308. A rim 338 extends annularly around proximal end 308. This deposition gas flows through gas distributor 300, exiting at apertures 310, and onto a substrate position on the substrate support member.

Apertures 310 are disposed on the gas distributor face 304 at a step 312, a raised surface. Step 312 can form an oval level or, more preferably, a circular level on gas distributor face 304 having a predetermined diameter. The diameter can range from about 0.01 inches to about 3.00 inches. Step 312 can have a vertical height in a range of about 0.60 inches to about 0.75 inches, and have a slope in a range of about 90 deg to about 15 deg. Step 312 improves gas distribution of gas distributor 300. In particular, the deposition gas can be dispersed further out to the periphery of the substrate support member as a result of step 312. Decreasing the slope of step 312 further disperse the gas towards the outside. While gas distributor 300 shows an embodiment of the step and apertures, other embodiments are possible, for example as described in U.S. application Ser. No. 11/075,527, filed Mar. 7, 2005, the full disclosure of which has been previously incorporated herein by reference.

In specific embodiments, gas distributor 300 can have 4, 6, 8, or more apertures 310. These apertures 310 are evenly distributed along the circumference of step 312 or, alternatively, weighted to a particular portion thereof. The placement and number of apertures 310 can be tuned for a specific application to achieve uniform distribution of deposition gas unto the substrate. Likewise, the diameter of apertures 310 can also be tuned. The diameter can be in the range of about 0.005 inches to about 0.250 inches. In a specific embodiment, the diameter of apertures 310 are 0.060 inches.

A baffle 320 is formed so as to deflect a clean gas. Baffle 320 includes gas deflection surface 302. Gas deflection surface 302 includes a concave surface 322 and a portion of a convex surface 346. Gas deflection surface 302 and baffle 320 are rotationally symmetric about an axis 314. Concave surface 322 is formed to fit a radius 324. Concave surface 322 includes an upper portion 328 and a lower portion 329, so that concave surface 322 extends from an upper boundary 322a to a lower boundary 322b. An arc 326 of radius 324 extends from upper boundary 322a to lower boundary 322b. Gas deflection surface 302 transitions from concave surface 322 to convex surface 346 at lower boundary 322b. Convex surface 346 is formed in a flange 330.

Convex surface 346 is formed to match an arcuate path of a radius 348. Convex surface 346 and concave surface 322 are arranged so that gas deflection surface 302 transitions from concave surface 322 to convex surface 346 at lower boundary 322b with a continuous surface. The intersection of concave surface 322 with convex surface 346 is at a slight angle to provide a smooth continuous surface transition as lower boundary 322b. In an alternate embodiment, this smooth transition is accomplished by setting the slope of the convex and concave surfaces to zero at lower boundary 322 so that the transition from the concave surface to the convex surface is completely smooth as the angle of the concave surface is matched to the angle of the convex surface at the transition. In yet another embodiment, the intersection of the concave surface with the convex surface is at a substantial angle to provide a continuous transition surface with a slight bend at the transition from the concave surface to the convex surface.

Gas distributor 300 includes a maximum width 340 across the gas distributor. Maximum width 340 corresponds to a diameter across convex surface 346. Maximum width 346 has a range from about 1.4 to 2.0 inches, and is typically about 1.7 inches.

With respect to the lower surface of the gas distributor, a smooth transition is formed at the transition between gas distributor face 304 and convex surface 346, similar to the smooth transition from concave surface 322 to convex surface 346. Flange 330 has a thickness 342. Thickness 342 corresponds to a distance equal to twice radius 348.

Figure 3B:
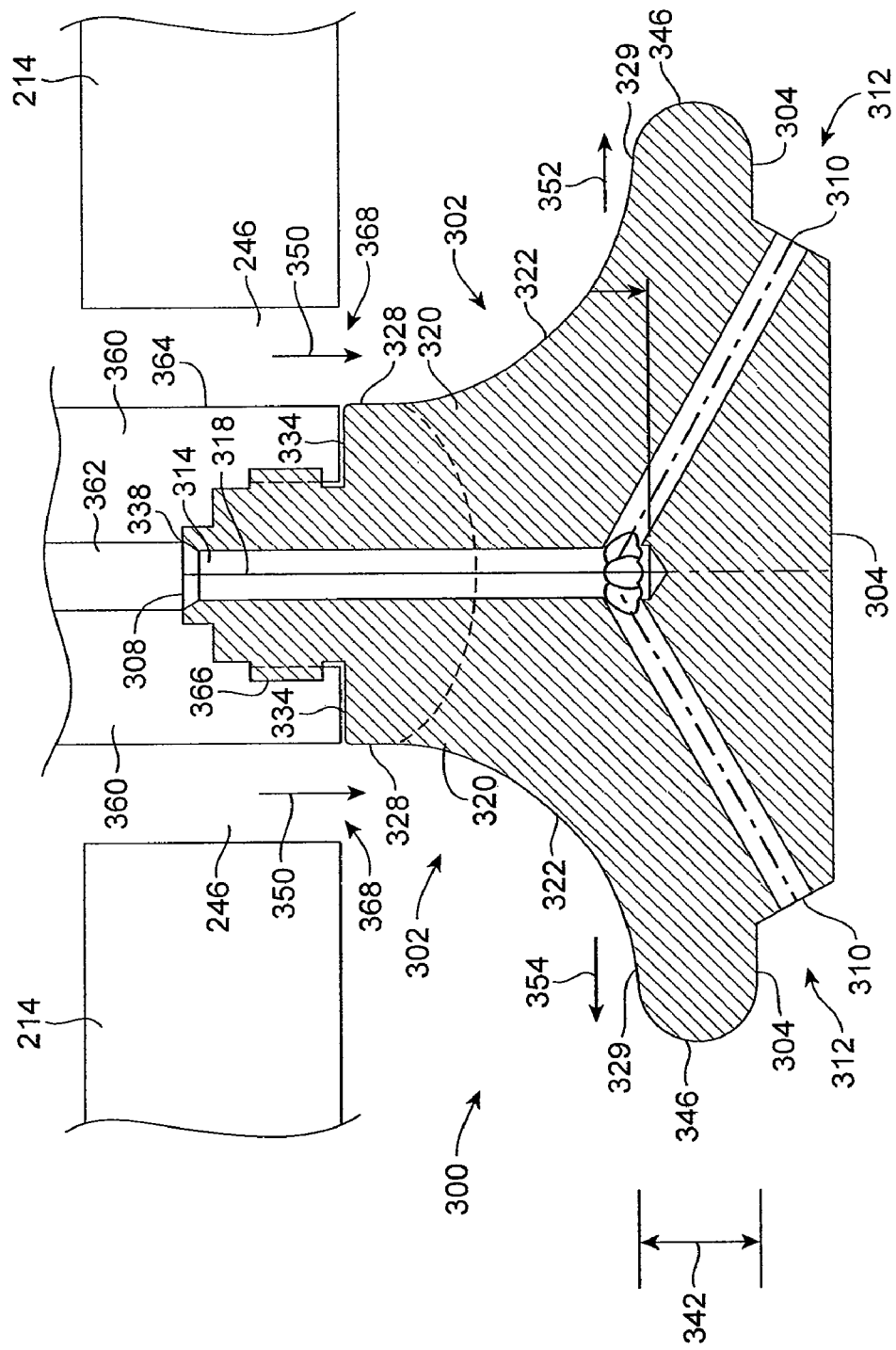
FIG. 3B is a cross-sectional view of a gas distributor positioned in a semiconductor processing chamber according to an embodiment of the present invention.

FIG. 3B is a cross-sectional view of a gas distributor positioned in a semiconductor processing chamber according to an embodiment of the present invention. Gas distributor 300 is designed to be positioned in the semiconductor gas processing chamber. As positioned in the chamber, gas deflection surface 302 corresponds to an upper exposed surface of the gas distributor, and gas distributor face 304 corresponds to a lower exposed surface of the gas distributor. Gas distributor 300 is supported by an annular structure 360. Annular structure 360 has a channel 362 formed therein to deliver the deposition gas. Rim 338 engages annular structure 360 and is adapted to form a seal with annular structure 360. Threads 336 mate with corresponding threads on annular structure 360. A shoulder 334 is located on the gas distributor adjacent to upper portion 328 of the concave gas deflection surface. Shoulder 334 mates with a corresponding surface formed in an annular structure 360. Annular structure 360 has an outer surface 364 which matches upper portion 328 of the concave gas deflection surface so as to provide a smooth surface transition from the annular support structure to the gas deflection surface. Top vent 246 includes an annular opening 368 into the chamber.

The baffle acts to divert the flow of the clean gas from a first direction to a second direction which is transverse to the first direction. Top vent 246 directs the clean gas downward in a first direction 350 along upper portion 328 of the gas deflection surface. Concave surface 322 directs the clean gas horizontally in a second direction 352 along lower portion 329 of concave surface 322, and second direction 352 is transverse to first direction 350. Concave surface 322 also directs the clean gas horizontally in a third direction 354, and third direction 354 is transverse to first direction 350. Concave portion 322 comprises about 90% of an exposed surface area of gas deflection surface 302. Gas deflection surface 302 extends along second direction 352 for a distance less that thickness 342 of flange 330.

Figure 3C:
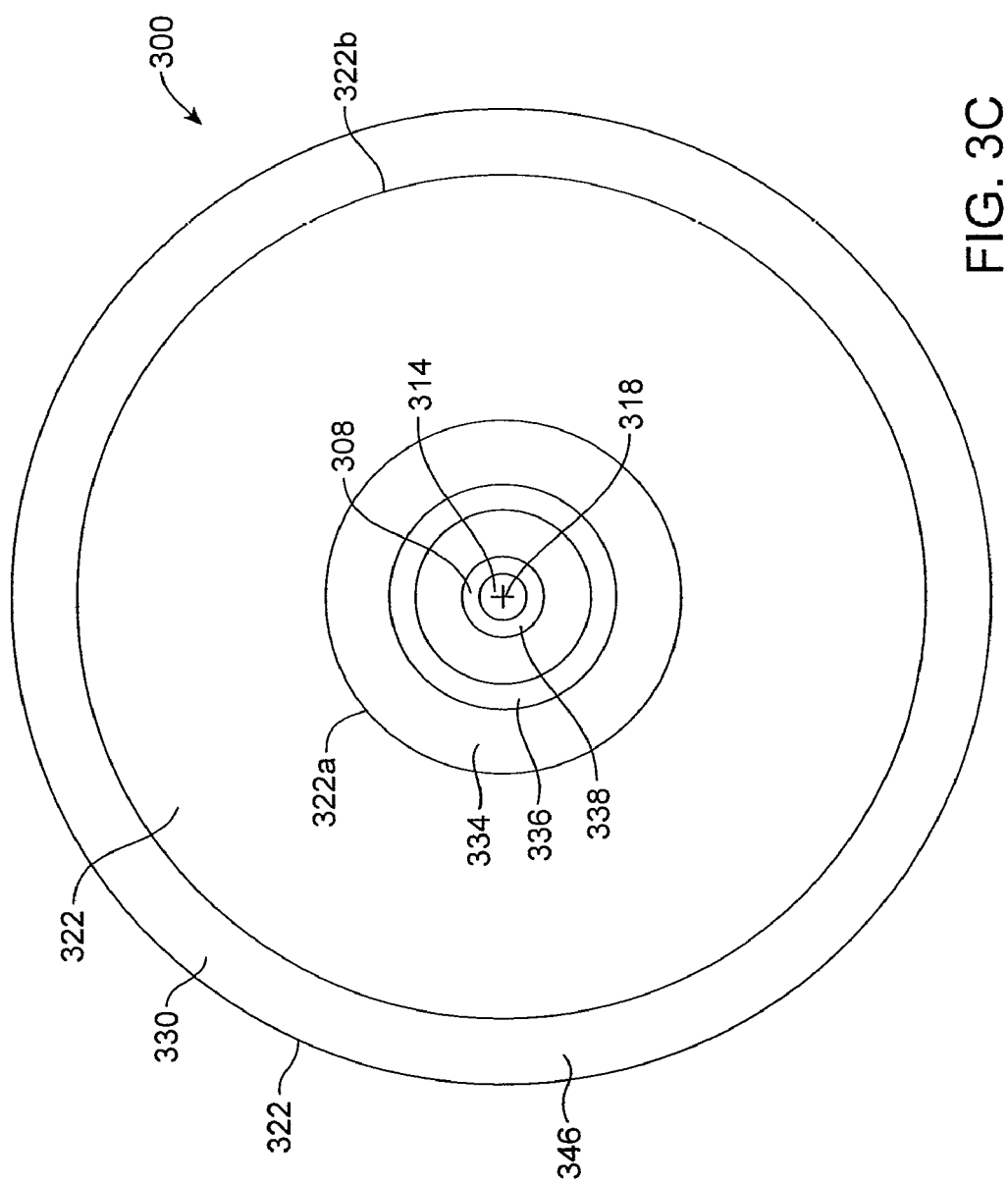
FIG. 3C is a top view of a gas distributor as in FIG. 3A according to the embodiment of the present invention.

FIG. 3C is a top view of a gas distributor as shown in FIG. 3A according to an embodiment of the present invention. As can be seen in FIG. 3C, many of the structures shown in FIG. 3A are annular and rotationally symmetric. Outer edge 332 of gas distributor 300 has a circular shape. Flange 330 has an annular shape. Lower boundary 322b has a circular shape. Concave surface 322 of the gas deflection surface has an annular shape. Upper boundary 322a of concave surface 322 has a circular shape. Shoulder 334 has an annular shape. Threads 336 have an annular shape. Rim 338 has an annular shape. Axis 318 is shown for reference.

With reference to FIGS. 3A and 3C, it will be appreciated that concave surface 322 comprises a portion of a first torus, and convex surface 346 comprises a portion of a second torus. Concave surface 322 is defined by radius 324 rotated about axis 314 to define the first torus. Convex surface 346 is defined by radius 348 rotated about axis 318 to define the second torus. Thus, lower boundary 322b is a boundary defined by the intersection of two toric surfaces adapted to mate with a smooth transition from the first toric surface to the second toric surface. In alternate embodiments, either the concave surface or the convex surface, or both, are defined by non-toric shapes, for example shapes defined by elliptical curved surfaces, cubic splines and the like. Also, stepped surfaces using several small steps can be used to define the concave and convex surfaces.

Figure 4:
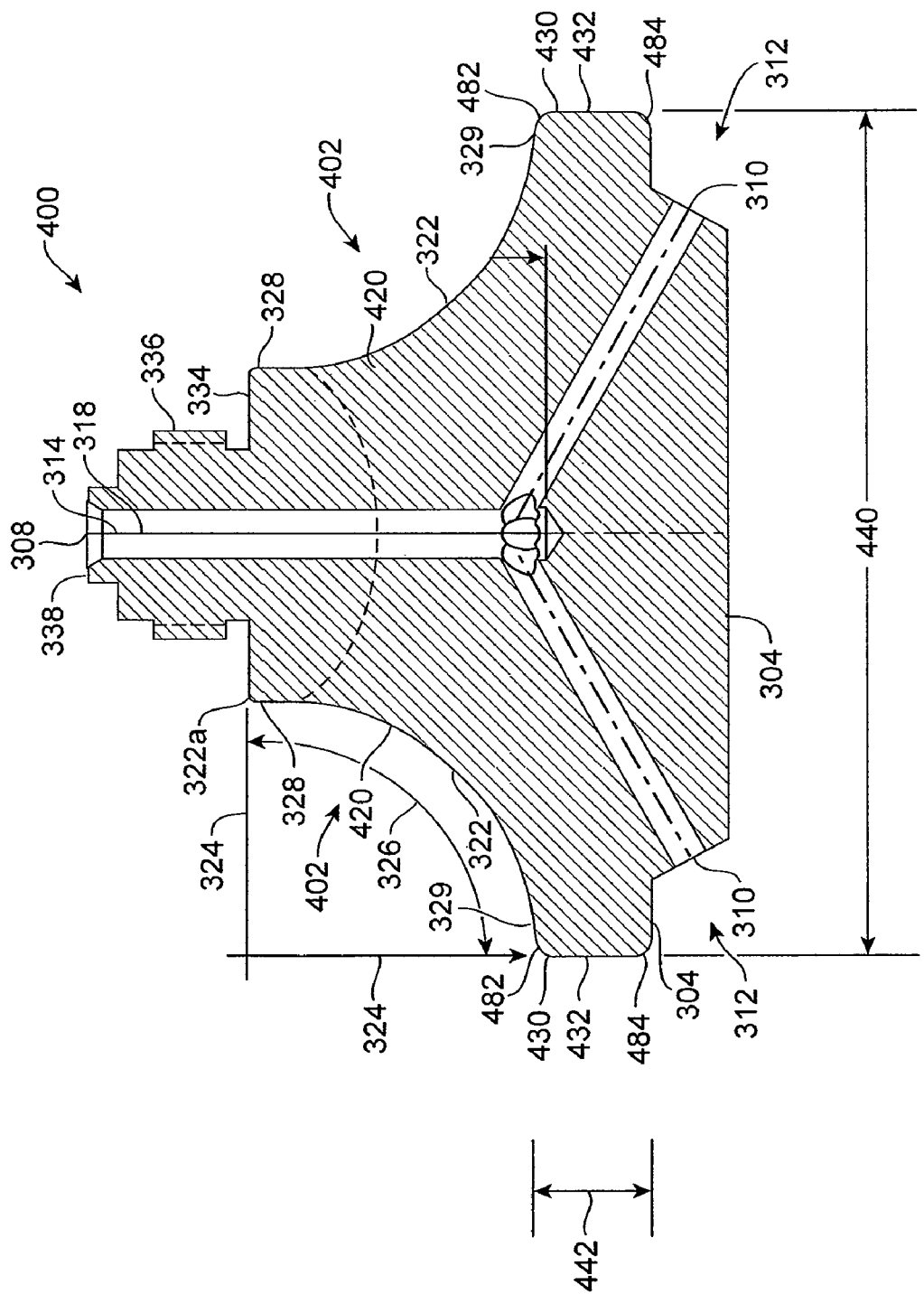
FIG. 4 is a cross-sectional view of a gas distributor with a truncated gas deflection surface according to an embodiment of the present invention.

FIG. 4 is a cross-sectional view of a gas distributor 400 with a truncated gas deflection surface according to an embodiment of the present invention. A baffle 420 has a gas deflection surface 402 formed thereon. Gas deflection surface 402 includes the concave surface 322 as described above, including upper portion 328 and lower portion 329. Gas deflection surface 402 ends with annular edge 482. A flange 430 includes an cylindrical outer surface 432. A maximum width 440 across the baffle corresponds to the diameter across cylindrical outer surface 432. Annular edge 482 connects gas deflection surface 402 with outer cylindrical surface 432. Annular edge 482 is rounded to fit a short radius of curvature and comprises a convex toric surface. An annular edge 484 connects gas distributor face 304 with cylindrical outer surface 432. A thickness 442 of flange 430 corresponds to a distance across flange 430 from lower portion 329 to an annular portion of gas distributor face 304 near annular edge 484.

Figure 5:
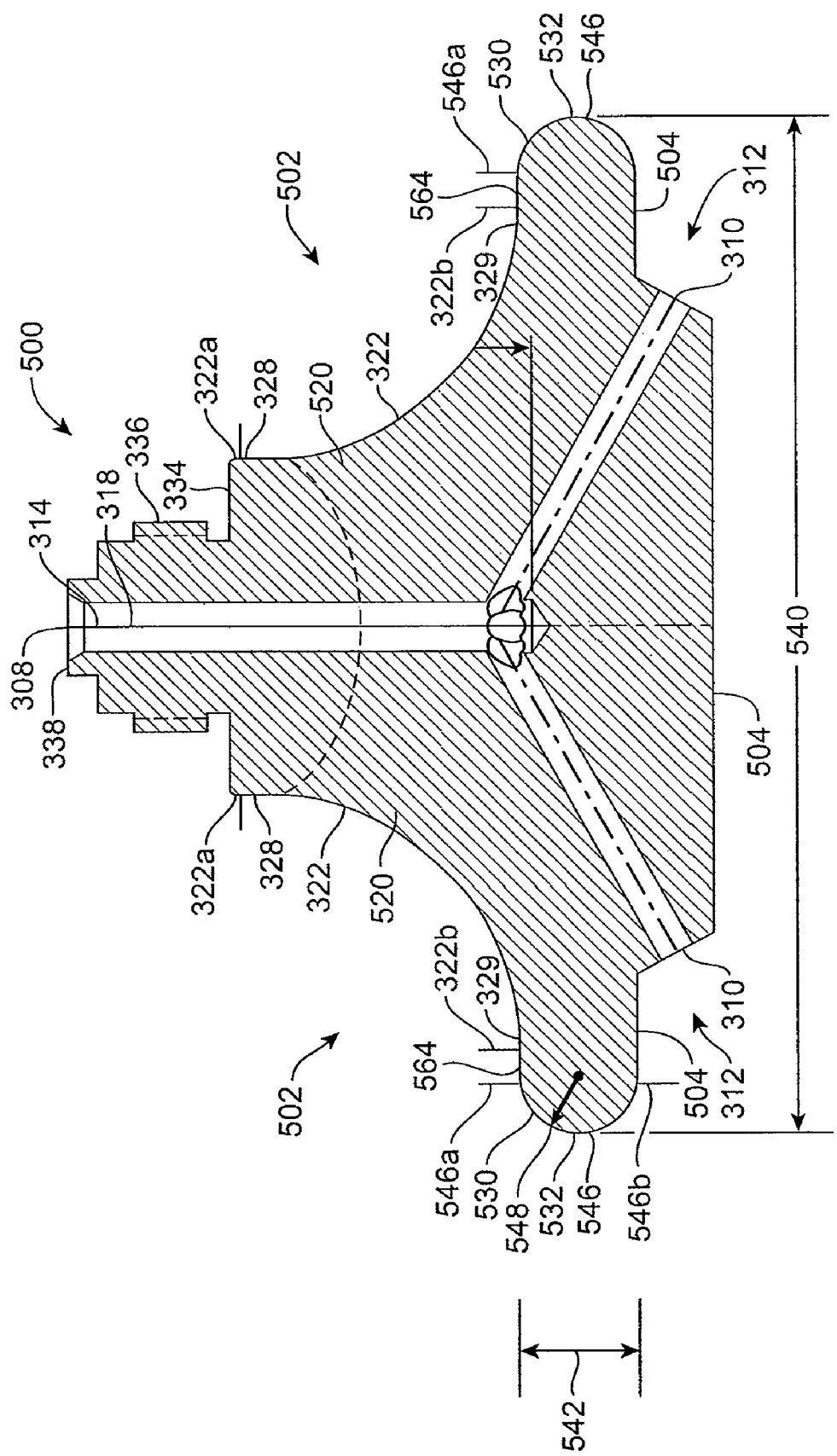
FIG. 5 is a cross-sectional view of a gas distributor with an annular flat portion extending between concave and convex gas deflection surfaces according to an embodiment of the present invention.

FIG. 5 is a cross-sectional view of a gas distributor 500 with an annular flat transition portion 564 extending between concave and convex gas deflection surfaces according to an embodiment of the present invention. The concave surface and convex surfaces are toric surfaces as described above. Gas distributor 500 includes a baffle 520 with a gas deflection surface 502 formed thereon. Concave portion 522 comprises about 75% of an exposed surface area of gas deflection surface 502. Gas distributor 500 includes a gas distributor face 504 adapted to distribute a deposition gas with apertures 310 and a step 312 as described above. Gas deflection surface 502 includes concave surface 322, annular flat transition portion 564 and an upper portion of a convex surface 546. Concave surface 322 extends between upper boundary 322a and lower boundary 322b and includes upper portion 328 and lower portion 329 as described above. Annular flat transition portion 564 provides a smooth transition from concave surface 322 to convex surface 546.

Convex surface 546 includes a radius 548 and other attributes of the gas distributor. Convex surface 546 extends between an upper boundary 546a and a lower boundary 546b. Convex surface 546 includes an outer edge 532. A maximum width 540 across the gas distributor corresponds do a diameter across the distributor define by outer edge 532. Annular flat transition portion 564 extends between lower boundary 322b of concave surface 322 and upper boundary 546a of convex surface 546. Lower boundary 546b is positioned between convex surface 546 and gas distributor face 504. A flange 530 includes annular flat transition portion 564 and convex surface 546. A flange thickness 542 corresponds to a distance equal to twice the radius 548.

Dimensions of annular flat transition portion are related to other dimensions of the gas distributor. For example, the distance of annular flat transition portion 564 along maximum width 540 is no more than about 10% of the maximum width as shown in FIG. 5. In some embodiments the distance of the annular flat transition portion is no more than about 20% of the maximum width. In other embodiments, the distance of the flat annular transition portion is no more than about 5% of the maximum width. In some embodiments, there is no flat annular transition portion, for example as shown above in FIGS. 3A to 3C, as the concave portion transitions directly to the convex potion along the boundary between the convex portion and the concave portion.

Figure 6:
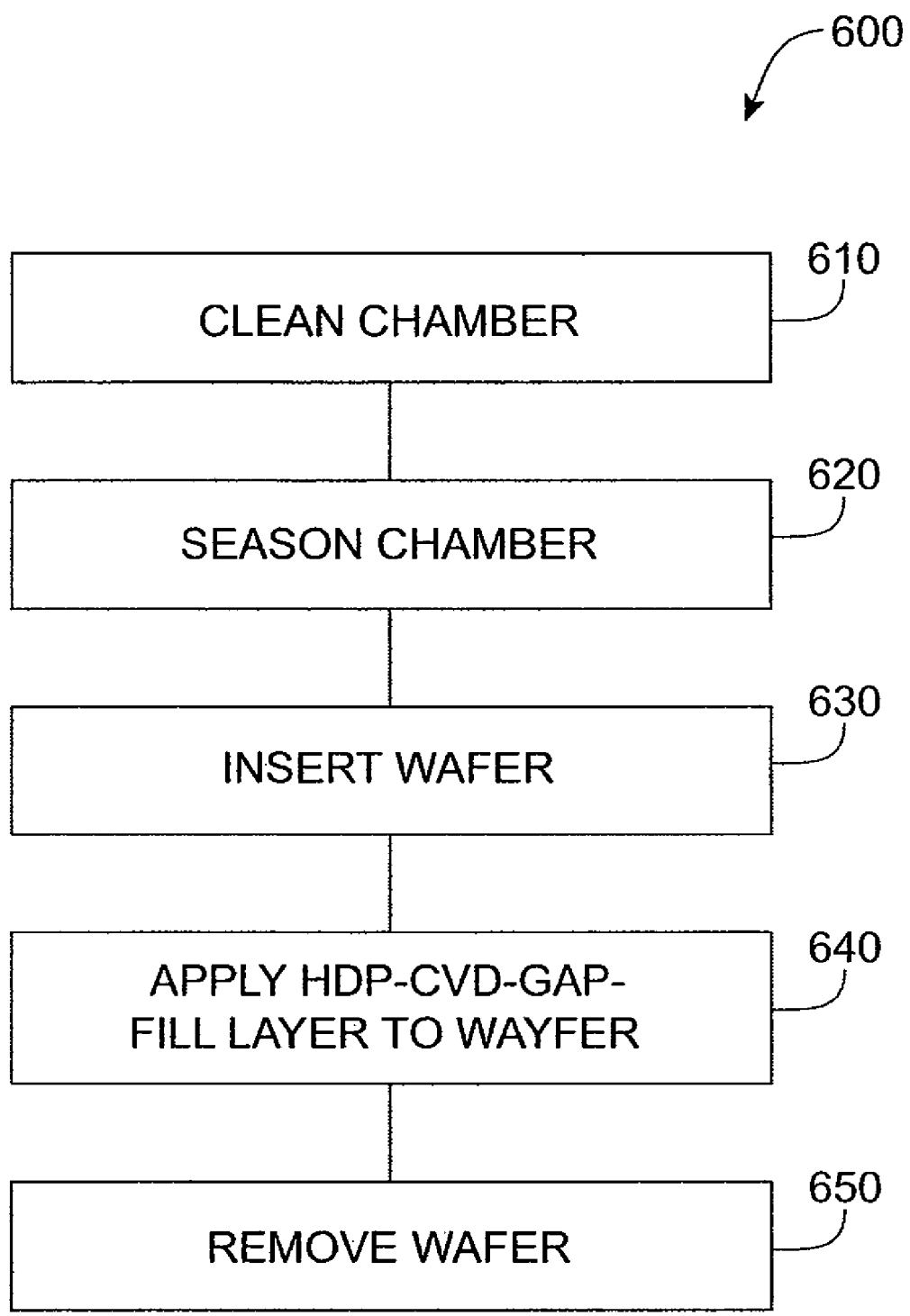
FIG. 6 is a flow chart illustrating a method of processing a wafer with a decreased season time and decreased Al contamination, in accordance with an embodiment of the present invention.

FIG. 6 is a flow chart illustrating a method 600 of processing a wafer with a decreased season time and Al contamination, in accordance with an embodiment of the present invention. A clean chamber step 610 cleans the chamber with the gas baffle as described above, for example as shown in FIGS. 3A to 3C. The amount of time required to clean the chamber will depend on the nature of the semiconductor processes employed, the season time, the clean gas and/or gasses used and the temperature. A typical clean time ranges from about 2 minutes to 7 minutes, and is often from 3 to 5 minutes, for example 3 to 4 minutes. A season chamber step 620 seasons the chamber with a deposition gas to provide a protective coating as described above, for example silane used to deposit a protective $SiO_2$ layer. The amount of time to season the chamber is less than 60 seconds, for example from about 25 to 60 seconds, often from about 25 to 45 seconds, and preferably from about 25 to 35 seconds. An insert wafer step 630 inserts a semiconductor wafer into the chamber so that the wafer is positioned as described above. An apply HDP-CVD gap-fill layer to wafer step 640 applies a gap fill layer to the wafer with an HDP-CVD process as described above. The HDP-CVD process can be any one of a lower power process, a medium power process, and a high power process. The gap fill process is typically applied for about 60 seconds. A thickness of the gap fill layer applied with the gap fill process is often from about 40000 A (400 nm) to 8000 A (800 nm) thick, for example to 4000 A (400 nm) to 6000 A (4000 nm) thick, and typically about 5000 A (500 nm) thick. Although the exact amount of Aluminum contamination in the gap-fill layer of the processed wafer will depend upon the exact parameters selected, the number of Al atoms is typically less than $2 \times 10^{12}$ atoms per square centimeter, for example from about $0.3 \times 10^{12}$ to $2.0 \times 10^{12}$ atoms per square centimeter, and can be from about $0.3 \times 10^{12}$ to $1.5 \times 10^{12}$ atoms per square centimeter, and preferably from about $0.3 \times 10^{12}$ to $1.0 \times 10^{12}$ atoms per square centimeter. A remove wafer step 650 removes the wafer from the chamber so that the wafer can be subject to additional process steps outside the chamber. After remove wafer step 650, the chamber is cleaned and steps 610 to 650 are repeated for additional wafers.

Any combination of chamber clean time, season time, and process power can be selected to provide a desired level of metal atom contamination. As season time is increased, metal atom contamination decreases and the season time is selected to provide metal ion contamination that is below a predetermined maximum tolerated amount. To optimize wafer throughput, one selects the shortest season time that provides metal atom contamination below the predetermined amount. For example, a season time of 30 seconds and can provide a metal ion contamination of $1.2 \times 10^{12}$ Al atoms per square centimeter that is below a maximum tolerated amount of $1.5 \times 10^{12}$ Al atoms per square centimeter. With a season time of 30 seconds, the total time to clean the chamber, place the wafer in the chamber, process the wafer in the chamber and remove the wafer from the chamber corresponds to a throughput of at least about 8 wafers per hour.

It should be appreciated that the specific steps illustrated in FIG. 6 provide a particular method of processing a wafer according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

3. Experimental Results

Preliminary testing with embodiments of the present invention show that significant improvements can be achieved, including reduced Al contamination and increase throughput of wafers processed in the chamber. Testing with embodiments of the present invention typically included single piece AlN (aluminum nitride) gas distributors formed from a mold and $NF_3$ clean gas, although other gas distributor materials, for example Alumina, and clean other gases, for example $F_2$, can be used. As an example, preliminary testing with embodiments using a high power process has shown that Al contamination can be reduced from $1.3 \times 10^{13}$ atoms per square centimeter on the substrate with a season time of 120 s for a prior baffle to as in FIG. 1 to Al contamination of $1.2 \times 10^{12}$ atoms per square centimeter on the substrate with a season time of 30 s for a baffle as in FIG. 3. The thickness of the coatings tested was about 8000 A. Therefore, an approximate order of magnitude decrease in Al contamination is achieved while decreasing the season time from 120 s to 30 s with a high power process. A decrease in season time from 120 s to 30 s can result in an increase in wafers processed per hour from about 7 wafers to 8 wafers as the chamber is seasoned several times during the processing of a wafer.

Figure 7:
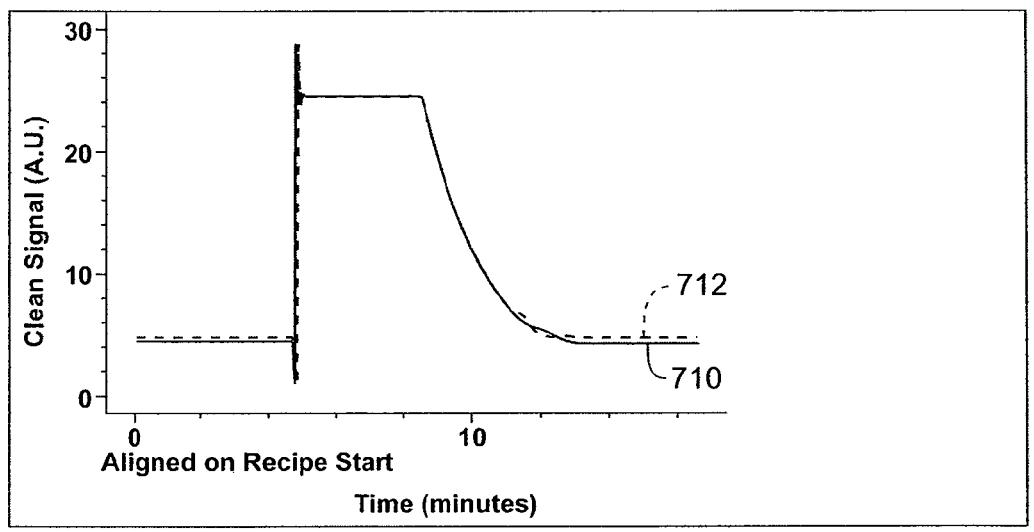
FIG. 7 shows a comparison of clean end-points comparison for a gas distributor as in FIG. 1 versus a gas distributor as in FIG. 3 according to an embodiment of the present invention.

FIG. 7 shows a comparison of clean end-points for a prior gas distributor as in FIG. 1 and a gas distributor as in FIG. 3 according to an embodiment of the present invention. The season time for each tested embodiment was the same. A "clean signal" in arbitrary units versus time is shown in FIG. 7. Clean signals 710 and 712 are shown for the prior distributor and the tested embodiment, respectively. The clean signals were measured with Fourier Transform Infrared spectroscopy (FTIR). The clean signals for the two distributors are nearly identical and show no substantial differences. Therefore, embodiments of the present invention can provide cleaning characteristics that are nearly identical with the tested prior baffle so that the tested embodiment is compatible with systems that use the prior baffle, and the tested embodiment can be provided as an upgrade to systems that use the prior baffle.

Figure 8:
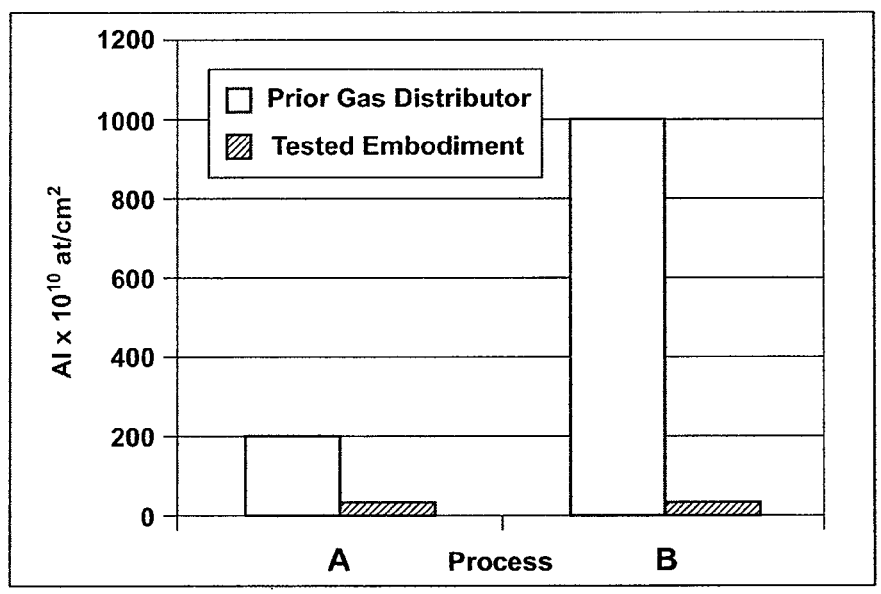
FIG. 8 shows a comparison of Al contamination in a processing chamber with a previously known gas distributor as in FIG. 1 versus a gas distributor as in FIG. 3 according to an embodiment of the present invention.

FIG. 8 shows a comparison of Al contamination in a processing chamber with a prior gas distributor as in FIG. 1 versus a gas distributor as in FIG. 3 according to an embodiment of the present invention. The season time was set to 120 s for the processes used for both baffles to provide an assessment of the effect of the baffle on Al contamination. Process A was a medium power process having a power of approximately 10 kW, and process gases included $NF_3$, He, $SiH_4$ and $O_2$ gases. As process A used $NF_3$ and medium power, chemical reactions associated with fluorine are believed to be the primary cause of chamber contamination. Medium power processes generally use power of approximately Process B was a high power process with a power of approximately 18 kW and process gases that included $NF_3$, $H_2$, $SiH_4$ and $O_2$. As process B was a high power process, thermal reactions, for example sublimation, are believed to be the primary cause of chamber contamination. With respect to process A, the tested prior baffle provided Al contamination of approximately $200 \times 10^{10}$ Al atoms per square centimeter and the tested embodiment provided approximately $70 \times 10^{10}$ Al atoms per square centimeter. The thickness of the coating applied with process A was about 4000 A. With respect to process B, the prior baffle provided Al contamination of approximately $1000 \times 10^{10}$ Al atoms per square centimeter and the tested embodiment provided approximately $30 \times 10^{10}$ Al atoms per square centimeter. The thickness of the coating applied with process B was about 8000 A. Thus, the tested embodiment provided approximately a factor of three improvement with the medium power process and approximately a factor of thirty improvement with the high power process.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of processing a semiconductor wafer in a semiconductor process chamber, the method comprising:
    cleaning a wall of the semiconductor process chamber using a clean gas that is deflected toward the wall by a gas deflection surface of a gas distributor, wherein a concave portion of the gas deflection surface comprises at least about 75% of a surface area of the gas deflection surface;
    seasoning the semiconductor process chamber for about 25 to 60 seconds to deposit a protective layer in the semiconductor process chamber;
    placing the semiconductor wafer in the semiconductor process chamber;
    coating the semiconductor wafer with a dielectric layer using an HDP-CVD process, wherein a concentration of metal atoms in the dielectric layer is no more than about $2 \times 10^{12}$ metal atoms per square centimeter; and thereafter
    removing the semiconductor wafer from the chamber.

2. The method of claim 1 wherein the HDP-CVD process comprises at least one of a medium power HDP-CVD process at a power of between about 8 to 12 kW or a high power HDP-CVD process at a power of between about 15 to 18 kW.

3. The method of claim 1 wherein the semiconductor process chamber is seasoned for about 25 to 45 seconds.

4. The method of claim 1 wherein the semiconductor process chamber is seasoned for about 25 to 35 seconds.

5. The method of claim 1 wherein the concentration of metal atoms in the dielectric layer is between about $0.3 \times 10^{12}$ to $2.0 \times 10^{12}$ metal atoms per square centimeter.

6. The method of claim 1 wherein the concentration of metal atoms in the dielectric layer is between about $0.3 \times 10^{12}$ to $1.5 \times 10^{12}$ metal atoms per square centimeter.

7. The method of claim 1 wherein the concentration of metal atoms in the dielectric layer is between about $0.3 \times 10^{12}$ to $1.0 \times 10^{12}$ metal atoms per square centimeter.

8. The method of claim 1 wherein the metal atoms are aluminum atoms.

9. The method of claim 1 wherein total time to clean the semiconductor process chamber, season the semiconductor process chamber, place the wafer in the semiconductor process chamber, coat the wafer in the semiconductor chamber and remove the wafer from the semiconductor process chamber corresponds to a throughput of at least about 8 semiconductor wafers per hour.

10. The method of claim 1, wherein the metal atoms in the dielectric layer comprises a dominant metal element and the dominant metal element corresponds to a dominant metal element of the gas distributor.

* * * * *